United States Patent [19]

MacKay

[11] Patent Number: 4,991,290
[45] Date of Patent: * Feb. 12, 1991

[54] FLEXIBLE ELECTRICAL INTERCONNECT AND METHOD OF MAKING

[75] Inventor: Colin A. MacKay, Austin, Tex.

[73] Assignee: Microelectronics and Computer Technology, Austin, Tex.

[ * ] Notice: The portion of the term of this patent subsequent to Sep. 5, 2006 has been disclaimed.

[21] Appl. No.: 369,596

[22] Filed: Jun. 16, 1989

Related U.S. Application Data

[63] Continuation of Ser. No. 222,487, Jul. 21, 1988, Pat. No. 4,862,588.

[51] Int. Cl.$^5$ ............................................ H01R 13/24
[52] U.S. Cl. ........................................ 29/884; 29/854; 439/67
[58] Field of Search .................. 29/854, 857, 847, 874, 29/884; 439/67

[56] References Cited

U.S. PATENT DOCUMENTS

| | | | |
|---|---|---|---|
| 2,396,725 | 3/1946 | Thomas, Jr. | 173/324 |
| 3,430,182 | 2/1969 | Blanch | 339/17 |
| 3,541,222 | 10/1970 | Parks et al. | 174/68.5 |
| 3,680,037 | 7/1972 | Nellis et al. | 339/61 M |
| 3,852,878 | 12/1974 | Munro | 29/629 |
| 4,024,631 | 5/1977 | Castillero | 29/626 |
| 4,067,104 | 1/1978 | Tracy | 29/626 |
| 4,125,310 | 10/1978 | Reardon, II | 339/92 M |
| 4,184,729 | 1/1980 | Parks et al. | 439/67 |
| 4,199,209 | 4/1980 | Cherian et al. | 339/59 M |
| 4,540,229 | 9/1985 | Madden | 339/75 M |
| 4,552,440 | 10/1985 | Eigenbrode | 339/14 R |

FOREIGN PATENT DOCUMENTS 53-58672  5/1978 Japan ................................... 29/847

OTHER PUBLICATIONS

M. Howett, "An Advanced High Density Interconnect System for Military/Space Applications".

T. Chung et al, "High Performance High Density Connectors Utilizing Multiple Layer Metal/Polymer Construction", 1987.

*Primary Examiner*—Timothy V. Eley
*Attorney, Agent, or Firm*—David M. Sigmond

[57] ABSTRACT

A method and apparatus for making a flexible interconnect for connection between stacks of electronic components. The method includes forming a plurality of holes through a flexible insulating material, depositiong electrically conductive metal studs into the holes extending out of at least one side and preferably both sides of the flexible material, and electrically interconnecting some of the electrically conductive metal studs by interconnects supported by the flexible material. The interconnects may be supported from the outside of the flexible material or embedded therein. Dummy studs may be provided in the flexible material extending to the outside and aligned with studs extending on the other side of the insulating material which are connected to the electrical interconnects.

18 Claims, 4 Drawing Sheets

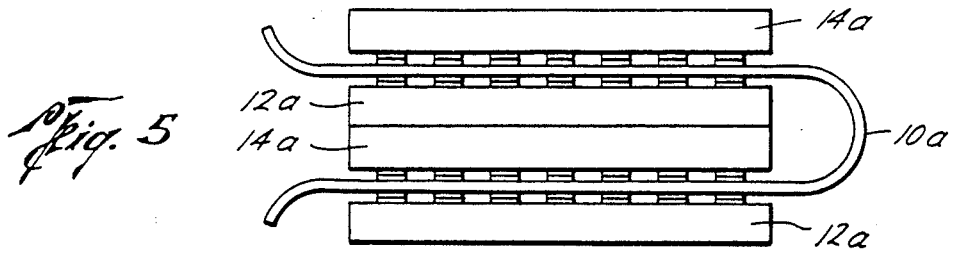
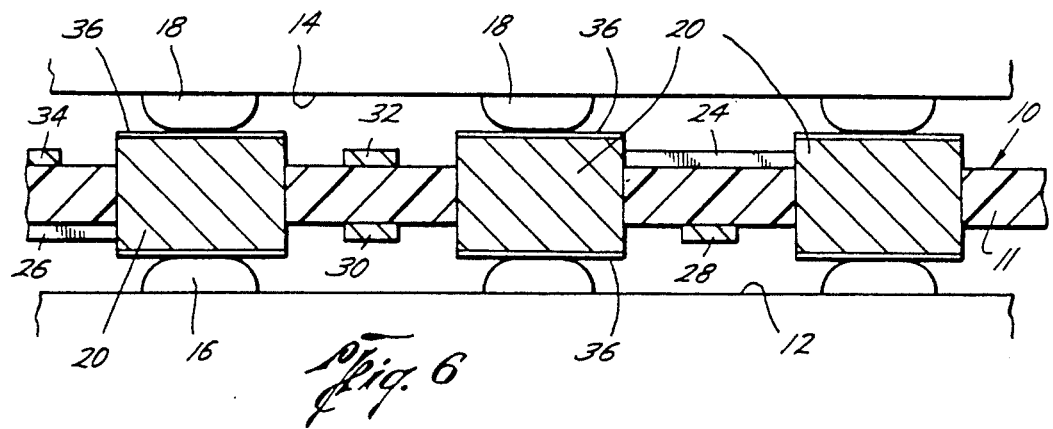
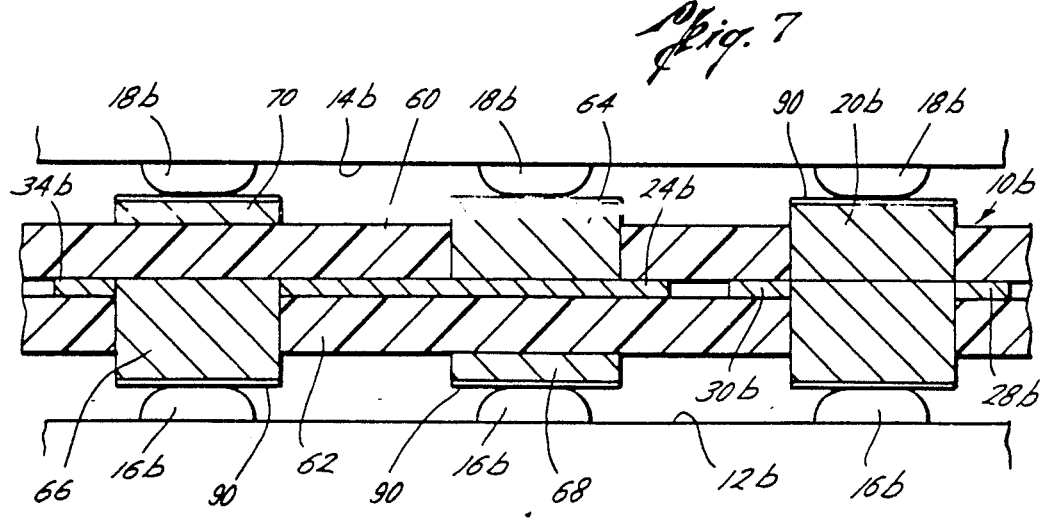

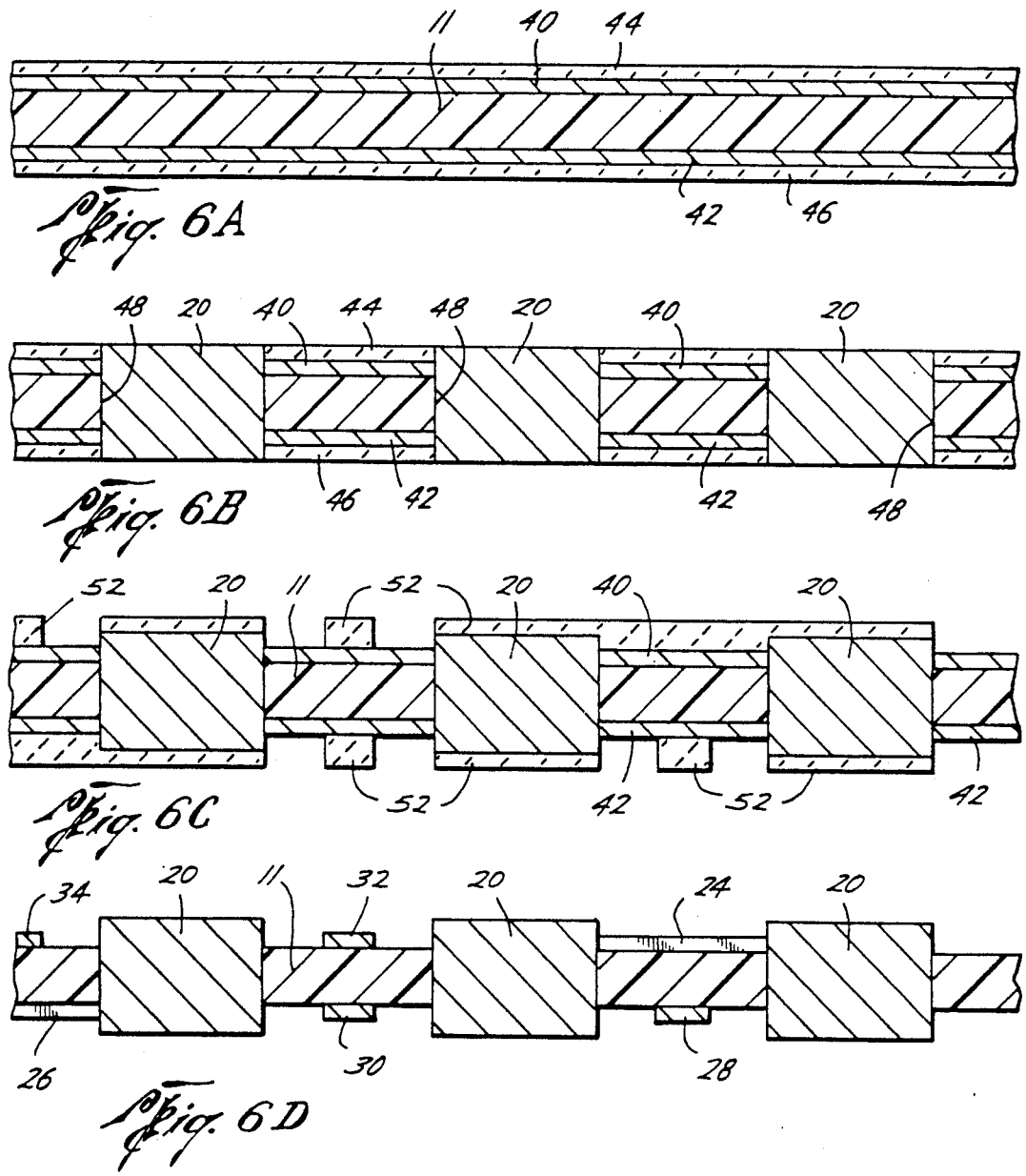

FLEXIBLE ELECTRICAL INTERCONNECT AND METHOD OF MAKING

This application is a continuation in part of U.S. Ser. No. 07/222,487, filed 07/21/88, now U.S. Pat. No. 4,862,588, and entitled "Method of Making a Flexible Interconnect."

BACKGROUND OF THE INVENTION

The present invention is directed to a flexible electrical interconnect for connection between adjacent stacks of electronic components which may be arranged in various configurations. Conductive metal studs embedded in the insulating material extend out of both sides of the insulating material for coacting with adjacent stacked electronic components such as electronic chips or carriers for interconnecting the stacks. Routing between the inlets and outlets of the electronic components is provided by electrically interconnecting some of the studs by interconnects supported either on the outside or embedded in the flexible material. Some of the studs may be dummies which are not connected to any of the electrical interconnects, but which are aligned with studs that are connected to the interconnects, for providing physical support for the active studs for making good electrical contacts with the electronic components.

SUMMARY

The present invention is directed to a method and apparatus for making a flexible interconnect for connection between stacks of electronic components which includes forming a plurality of holes through a flexible insulating material, depositing electrically conductive metal studs into said holes extending out of at least one side of the insulating material, and electrically connecting at least some of the studs by interconnects supported by the flexible material.

Another object of the present invention is wherein some of the electrically conductive metal studs may extend out of both sides of the insulating material and in some embodiments dummy studs may be provided on the flexible insulating material on a side opposite and aligned with some of the studs which are connected to the electrical interconnects.

Yet a further object of the present invention is the method of making a flexible interconnect by forming a plurality of holes through a flexible insulating material having a layer of conductive material on at least one side, adding a resist mask layer on the conductive material and depositing electrically conductive metal studs into at least some of said holes extending out of the top and bottom of the holes and extending out of the insulating material and conductive material. The method includes removing the resist mask layer and applying an etch mask layer on the conductive material over the conductive material to cover desired electrical interconnections while leaving undesired electrical interconnections uncovered. Thereafter, the undesired electrical interconnections are etched and the etched mask is removed.

Still a further object of the present invention is the method of making a flexible interconnect by forming a plurality of holes through a first flexible insulating material having a layer of conductive material on a first side and depositing electrically conductive metal studs into the holes. The method includes applying an etch mask layer on the conductive material to cover desired electrical interconnections while leaving undesired electrical interconnections uncovered and etching the undesirable electrical interconnections and removing the etched mask. The method includes forming a plurality of holes through a second flexible insulating material and bonding one side of the second insulating material to the conductive material. Thereafter, the method includes applying a resist mask on the second side of the second insulating material and depositing electrically conductive metal studs into the holes of the second insulating material.

Another object of the present invention is wherein at least some of the holes in the first insulating material are aligned with the holes in the second insulating material. The method further includes providing dummy studs on the outside of one of the insulating materials aligned with studs on the other side of the insulating materials.

A further object of the invention is wherein the dummy studs are provided by applying a resist mask to the insulating material leaving the desired locations of the dummy stud bare and depositing a dummy stud into the bare locations.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 5 is an elevational view illustrating the use of the flexible interconnect of the present invention in another configuration of stacked electronic components, FIG. 6 is an enlarged fragmentary elevational view, in cross section of the present invention between adjacent stacks of electronic components, FIGS. 6A, 6B, 6C and 6D are fragmentary elevational views illustrating the method of manufacturing the flexible interconnect of FIG. 6, FIG. 7 is an enlarged elevational view, in cross section, of another embodiment of the presnet invention in position between two stacked electronic components.

DESCRIPTION OF THE PREFERRED EMBODIMENT

Figure 1:
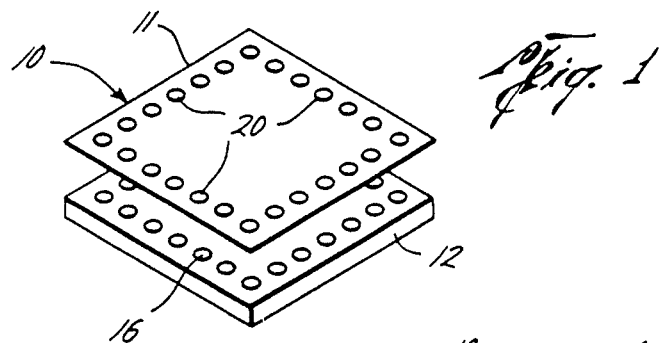
FIG. 1 is a schematic perspective view of one form of the flexible interconnect and one coacting electronic component.
Figure 2:
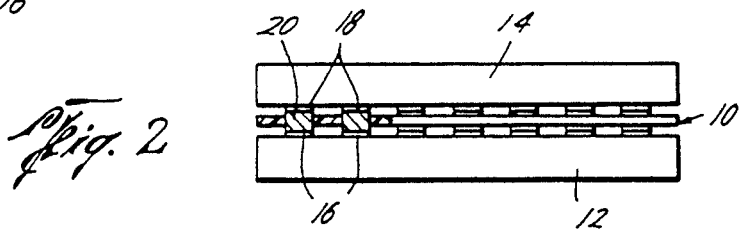
FIG. 2 is an elevational view, partly in section, the use of the flexible interconnect between two spaced electronic components.

Referring now to the drawings, particularly to FIGS. 1 and 2, one form of the flexible interconnect of the present invention is generally indicated by the reference numeral 10, to serve as an interconnection between at least two stacked electronic components 12 and 14, such as electronic chips or chip carriers. The electronic components 12 and 14 include a plurality of inlet or outlet pads 16 and 18, respectively, which are to be interconnected with each other or other components. The flexible interconnect 10 includes a plurality of electrically conductive metal studs 20 which serve the purpose of interconnecting the pads 16 and 18 to desired connections as well as providing an interconnect which will physically coact with the components 12 and 14 to provide good electrical contact.

The electrically conductive metal that is used for the studs is not limited to elemental metal, and can include alloyed mixtures as well. Preferably the studs are made of copper.

Figure 3:
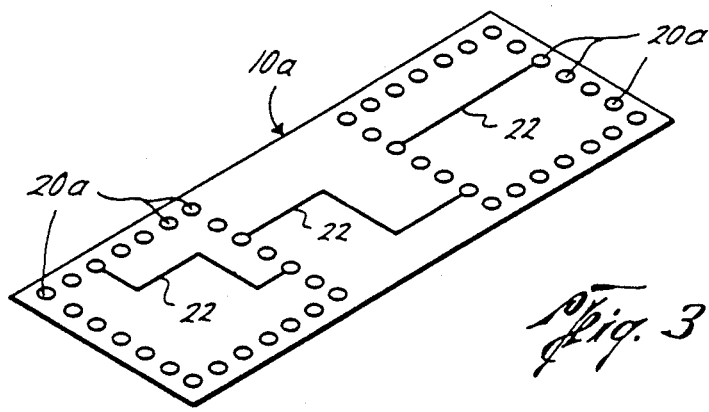
FIG. 3 is a schematic perspective view of one form of the flexible interconnect of the present invention illustrating providing electrical interconnects between certain of the studs in the interconnect.
Figure 4:
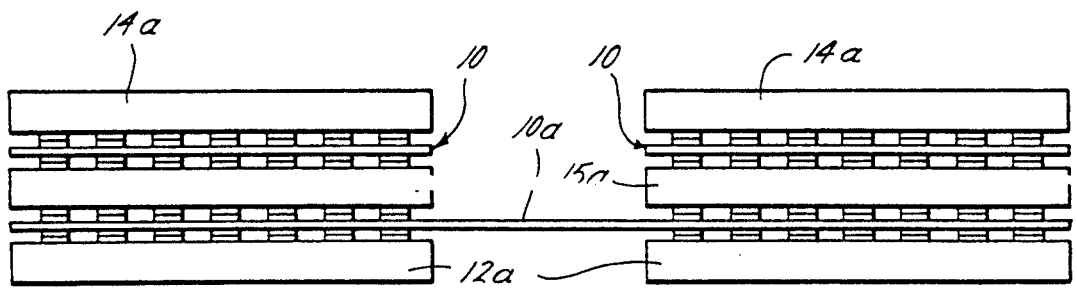
FIG. 4 is an enlarged elevational view of the flexible interconnect of the present invention illustrating interconnection between adjacent stacks of electronic components.

Referring now to FIGS. 3 and 4, another embodiment of the present invention is generally indicated by the reference numeral 10a includes a plurality of electrically conductive contact metal studs 20a having a plurality of electrical interconnects 22 for interconnecting some of the conductive studs 20a. The placement of the interconnects 22 may be as desired depending upon the requirements of the electronic components 12a, 14a and 15a. FIG. 5 illustrates another configuration for stacking components 12a and 14a with a different use of the flexible connector 10a.

Referring to FIG. 6, the flexible interconnect 10 is shown in an enlarged cross-sectional view being connected between electronic components 12 and 14 and their respective inlet and outlet pads 16 and 18, respectively, by electrically conductive metal studs 20 and suitable interconnects such as X directed interconnects 24 and 26 and Y directed interconnects 28, 30, 32 and 34. Preferably, the ends of the studs 20 are coated with a low melting point liquid metal or fusible alloy 36 such as Woods metal, Darcy alloy, gallium tin or gallium indium tin for making a good electrical contact between the electrically conductive metal studs 20 and the pads 16 and 18.

Referring now to FIGS. 6A–6D, the method of making the flexible interconnect pin of FIG. 6 is best seen. A flexible insulating material 11, such as polyimide or kapton is provided with one or more layers of an electrical conductor, such as copper, as a top layer 40 and a bottom layer 42. By way of example only, the thickness of the insulation 11 may be 1 to 5 mils and the thickness of the copper layers 40 and 42 may be 1 to 2 mils. A resist mask is provided over the layers 40 and 42 such as layers of resist mask 44 and 46. Any conventional resist mask may be used such as novalak or a dry film resist.

A plurality of holes 48, for example 10–25 mils in diameter, are formed through the structure of FIG. 6A by such means as punching, drilling, laser drilling, spark erosion, etc. As best seen in FIG. 6B the holes 48 are filled by depositing an electrically conductive material therein, by such methods as electroplating, electroless deposition, chemical vapor deposition, laser assisted deposition, evaporation, or sputtering to provide electrically conductive metal studs 20 which extend outwardly of the electrically conductive layers 40 and 42 and the insulating material 11. The resist mask layers 44 and 46 are then stripped, by conventional means, leaving the studs 20 and layers 40 and 42 exposed. Thereafter, an etch resist pattern, such as Shipley 1375 when copper layers are used, is placed on the layers 40 and 42 over the layers 40 and 42 and the studs 20 to cover desired electrical connections such as the electrical interconnections desired to form the X interconnections 24 and 26 and the Y interconnections 28, 30, 32 and 34.

The remainder of the layers 40 and 42 are left uncovered for removal. Thus, referring to FIG. 6C an etch resist 52 is placed to cover the desired electrical interconnections and the bare portions of the layers 40 and 42 are etched away by any suitable etching solution, such as sulfuric acid and hydrogen peroxide for copper layers, thereby leaving the structure of FIG. 6D. It is to be noted that this method provides studs 20 embedded in a flexible insulating material 11 for coacting with the pads 16 and 18 of the electrical components 12 and 14 for making good contact with the ability to be sandwiched inbetween the planar components 12 and 14 and provide any suitable manner of electrical connections required. Obviously, any desired pattern of X and Y electrical interconnects may be provided. And while the electrical interconnects can be formed by masking the conductor layers 40 and 42 in the desired pattern and etched, the electrical interconnections may be patterned and formed along with the studs 20 by providing a resist mask directly on the flexible insulating material 11 and depositing the interconnects thereon such as by electroplating.

In the embodiment of FIG. 6, the electrical interconnections 24, 26, 28, 30, 32, and 34 are shown on the exterior of the flexible insulating material 11 and are therefore exposed and possibly subjected to deterioration. Referring now to FIG. 7, another embodiment of the present invention is shown in which the electrical interconnects are formed embedded within the flexible insulating material and thus protected from such corrosion.

In FIG. 7, the flexible interconnect 10b is shown positioned between electrical components 12b and 14b and generally includes a first flexible insulating material layer 60 and a second flexible insulating material 62, at least one electrically conductive metal stud 20b extending through the first and second insulating materials 60 and 62 for making contact between one set of contact pads 16b and 18b. In addition, the connection 10b may include one or more studs 64 and 66 which only make connection between one of the contact pads, such as one of pads 18b and 16b, respectively, and the electrical interconnects, but which are backed up by dummy studs 68 and 70, respectively, for making good contact between the active studs 64 and 66 and their coating contacts. Suitable X and Y interconnections are provided embedded between the insulating material layers 60 and 62, such as Y directed interconnections 28b, 30b and 34b and X directed interconnection 24b.

Figure 7A:
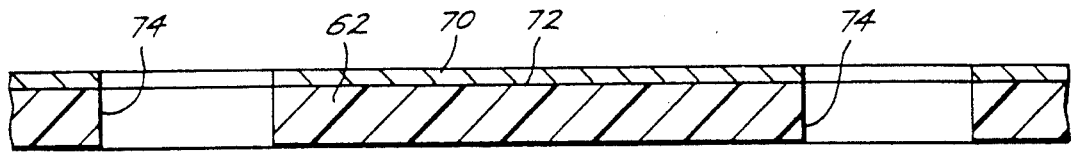
FIGS. 7A, 7B, 7C, 7D and 7E illustrate the method of manufacturing the embodiment of FIG. 7.
Figure 7B:
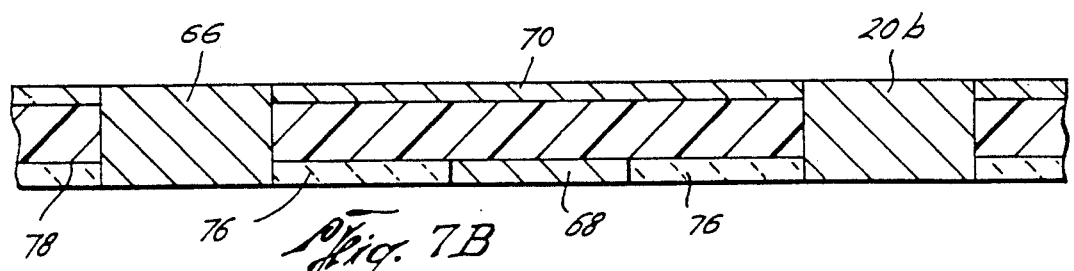

Referring now to FIGS. 7A–7E, the process of manufacturing the flexible interconnect 10b is best seen. A first flexible insulating material 62 having a layer of electrically conductive material 70, such as copper, on a first side 72 is provided in which a plurality of holes 74 are formed. A suitable resist mask 76 is provided on the second side 78 of the flexible material 62, as best seen in FIG. 7B, for depositing electrically conductive metal stud 66, the dummy stud 68, and one-half of electrically conductive metal stud 20b.

Figure 7C:
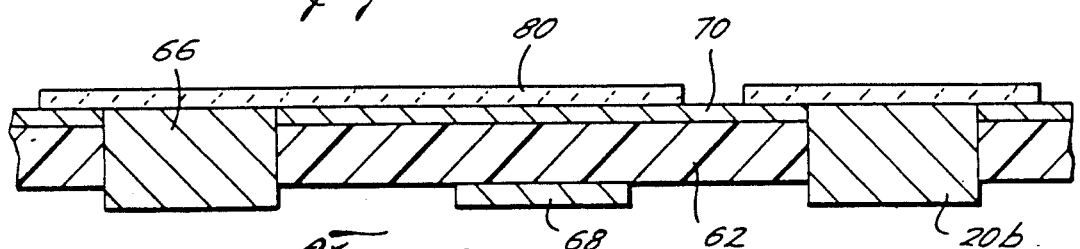
Figure 7D:
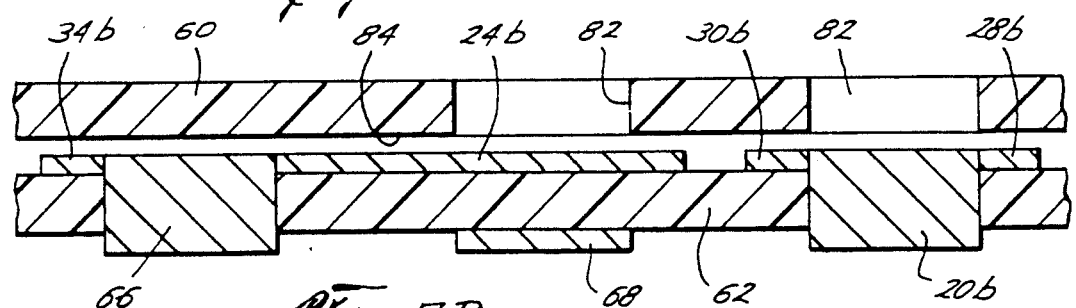

Referring now to FIG. 7C, an etch resist mask 80 is provided over the layer 70, to cover the desired electrical interconnections while leaving the remainder of the layer 70 bare for forming the desired X and Y direction interconnections. The bare material is then etched away by any desired process, such as ion milling or wet etching, and the etched mask is removed leaving the X and Y directed electrical interconnections 28b, 30b, 24b and 34b, as best seen in the lower half of FIG. 7D. Thereafter, a plurality of holes 82 are formed in a second flexible insulating material 60. The first insulating material 62 and second insulating material 60 are bonded together by bonding the side 84 of the second insulating material 60 to the electrically conductive layer of interconnects thereby embedding the X and Y directed interconnects therebetween.

Figure 7E:
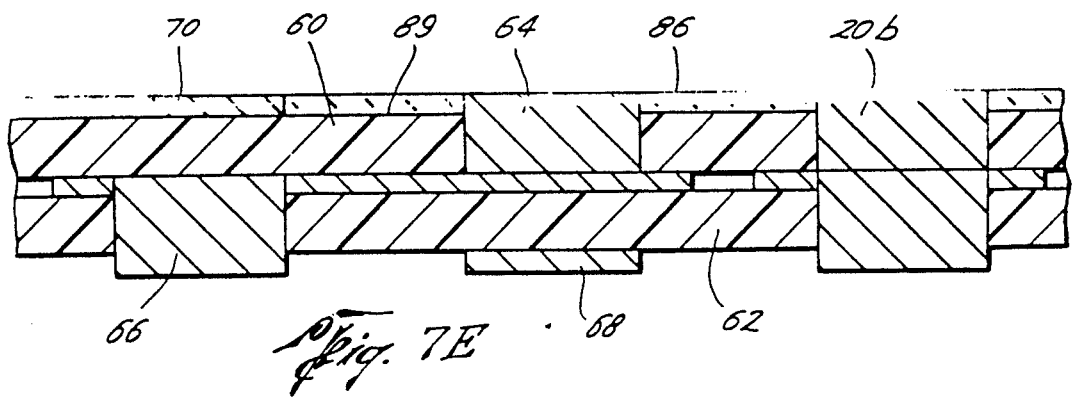

As best seen in FIG. 7E, a resist mask 86 is applied on the other side 89 of the second insulating material 60 to form a pattern for depositing the electrically dummy metal stud 70, electrically conductive metal stud 64 and the remainder of electrically conductive metal stud 20b. The resist mask is then removed forming the structure shown in FIG. 7. The structure of FIG. 7E may be utilized, as best seen in FIG. 7, to provide a flexible electrical interconnect 10b between electrical components 12b and 14b after coating the contacting surfaces of the electrically conductive metal stud with a suitable liquid metal 90.

If desired, other means of support besides the dummy studs may be used assure a good electrical connection between the conductive studs 64 and 66, and their respective contact pads 18b and 16b.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A method of making a flexible interconnect for connection between stacks of electronic components comprising,
    forming a plurality of holes through a flexible insulating material,
    depositing electrically conductive metal studs into said holes extending out of the top and bottom of the insulating material, and
    electrically interconnecting at least some of the deposited studs by interconnects supported by the flexible material.

2. The method of claim 1 wherein at least some of the interconnects are non-parallel.

3. A method of making a flexible interconnect for connection between stacks of electronic components comprising,
    forming a plurality of holes through a flexible insulating material having a layer of electrically conductive material on at least one side,
    adding a resist mask layer on the conductive material,
    depositing electrically conductive metal studs into at least some of said holes extending out of the top and bottom of the holes beyond the insulating material and conductive material,
    removing the resist mask layer,
    applying an etch mask layer on the conductive material over the conductive material to cover desired electrical interconnections while leaving undesired electrical interconnections uncovered,
    etching the undesired electrical interconnections, and removing the etch mask.

4. The method of claim 3 wherein at least some of the interconnects are non-parallel.

5. A method of making a flexible interconnect for connection between stacks of electronic components comprising,
    forming a plurality of holes through a first flexible insulating material having a layer of electrically conductive material on a first side,
    depositing electrically conductive metal studs into said holes,
    applying an etch mask layer on the conductive material to cover desired electrical interconnections while leaving undesired electrical interconnections uncovered,
    etching the undesired electrical interconnections,
    removing the etch mask,
    forming a plurality of holes through a second flexible insulating material,
    bonding one side of the second insulating material to the electrically conductive material,
    applying a resist mask on the second side of the second insulating material, and
    depositing electrically conductive metal studs into the holes of the second insulating material.

6. The method of claim 5 wherein at least some of the holes in the first insulating material are aligned with the holes in the second insulating material.

7. The method of claim 5 including providing dummy studs on the outside of one of the insulating materials aligned with studs on the other of the insulating materials.

8. The method of claim 7 wherein the dummy studs are provided by applying a resist mask to the insulating material leaving the desired locations of the dummy studs bare, and
    depositing dummy studs into the bare locations.

9. A method of making a flexible interconnect for connection between stacks of electronic components comprising,
    forming a plurality of holes through a first flexible insulating material having a layer of electrically conductive material on a first side,
    depositing electrically conductive metal studs into said holes,
    applying an etch mask layer on the conductive material to cover desired electrical interconnections, wherein at least some of the interconnections are non-parallel, while leaving undesired electrical interconnections uncovered,
    etching the undesired electrical interconnections,
    removing the etch mask,
    forming a plurality of holes through a second flexible insulating material,
    bonding one side of the second insulating material to the electrically conductive material,
    applying a resist mask on the second side of the second insulating material, and
    depositing electrically conductive metal studs into the holes of the second insulating material.

10. The method of claim 9 wherein at least some of the holes in the first insulating material are aligned with the holes in the second insulating material.

11. The method of claim 9 including providing dummy studs on the outside of one of the insulating materials aligned with studs on the other of the insulating materials.

12. The method of claim 11 wherein the dummy studs are provided by applying a resist mask to the insulating material leaving the desired location of the dummy stud bare, and depositing a dummy stud into the bare location.

13. A method of making a flexible interconnect for connection between stacks of electronic components comprising, forming a plurality of holes through a flexible insulating material having first and second sides, depositing electrically conductive metal studs into said holes extending out of at least one side of the insulating material, electrically interconnecting at least some of the studs by interconnects supported by the flexible material, and providing dummy studs on the second side of the flexible insulating material aligned with some of the electrically conductive metal studs.

14. The method of claim 13 wherein at least some of the interconnects are non-parallel.

15. A flexible interconnect for connection between stacks of electronic components comprising, a flexible insulating material having a plurality of holes, electrically conductive metal studs deposited in said holes extending out of the top and bottom of the insulating material, and electrical interconnects between at least some of the studs by interconnects supported by the flexible material.

16. The interconnect of claim 15 wherein at least some of the interconnects are non-parallel.

17. A flexible interconnect for connection between stacks of electronic components comprising, flexible insulating material having first and second sides having a plurality of holes, electrically conductive metal studs deposited in said holes extending out of at least one side of the insulating material, electrical interconnects between at least some of the electrically conductive studs by interconnects supported by the flexible material, and dummy studs on the second side of the flexible insulating material aligned with some of the electrically conductive studs.

18. The interconnect of claim 17 wherein at least some of the interconnects are non-parallel.

* * * * *

UNITED STATES PATENT OFFICE
CERTIFICATE OF CORRECTION

Patent No. 4,991,290          Dated 02/12/91

Inventor(s) MacKay

It is certified that error appears in the above-identified patent and that said Letters Patent is hereby corrected as shown below:

On the title page assignee should read
-- [73] Microelectronics and Computer Technology
       Corporation, Austin, TX --

Column 2, line 34, insert -- enlarged -- before "elevational",
    and insert -- illustrating -- before "the".

Column 2, line 50, insert -- , of one form -- before "of".

Column 2, line 56, change "presnet" to -- present --.

Column 4, line 45, change "coating" to -- coacting --.

Column 5, line 22, insert -- to -- before "assure".

Signed and Sealed this

Sixteenth Day of March, 1993

Attest:

STEPHEN G. KUNIN

Attesting Officer          Acting Commissioner of Patents and Trademarks